United States Patent [19]

Hasebe et al.

[11] Patent Number: 5,374,312
[45] Date of Patent: Dec. 20, 1994

[54] LIQUID COATING SYSTEM

[75] Inventors: Keizo Hasebe, Kofu; Kiyohisa Tateyama, Kumamoto; Yuji Yoshimoto, Shisui; Yuji Matsuyama, Oozu; Tetsuro Nakahara, Mashiki; Yoshio Kimura, Koshi, all of Japan

[73] Assignees: Tokyo Electron Limited, Tokyo; Tokyo Electron Kyushu Limited, Kumamoto; Kabushiki Kaisha Toshiba, Kawasaki, all of Japan

[21] Appl. No.: 144,492

[22] Filed: Nov. 1, 1993

Related U.S. Application Data

[63] Continuation of Ser. No. 824,234, Jan. 23, 1992, abandoned.

[30] Foreign Application Priority Data

Jan. 23, 1991 [JP] Japan ................ 3-006369
Jan. 29, 1991 [JP] Japan ................ 3-009080

[51] Int. Cl.5 ................................................ B05C 5/00
[52] U.S. Cl. ........................... 118/52; 118/56; 118/321; 118/694; 118/696; 118/698; 118/697; 118/320; 134/153; 134/902; 239/214; 239/222; 239/224; 239/379
[58] Field of Search ............ 118/52, 56, 320, 321, 118/694, 696, 697, 698; 134/153, 902; 239/214, 223, 222, 224, 379

[56] References Cited

U.S. PATENT DOCUMENTS

| | | |
|---|---|---|
| 3,019,718 | 1/1962 | Williams. |
| 4,326,553 | 4/1982 | Hall ........................ 134/902 |
| 4,774,109 | 9/1988 | Hadximihalis et al. .......... 118/410 |
| 4,932,353 | 6/1990 | Kawata et al. ............... 118/52 |
| 5,002,008 | 3/1991 | Ushijima et al. ............. 118/313 |
| 5,010,840 | 4/1991 | Busker et al. ............... 118/421 |
| 5,089,305 | 2/1992 | Ushijima et al. ............. 427/422 |
| 5,094,884 | 3/1992 | Hillman et al. .............. 118/52 |
| 5,127,362 | 7/1992 | Iwatsu et al. ............... 118/52 |
| 5,134,962 | 8/1992 | Amada et al. ............... 118/52 |

FOREIGN PATENT DOCUMENTS

| | | |
|---|---|---|
| 57-192955 | 11/1982 | Japan. |
| 58-17444 | 2/1983 | Japan. |
| 59-50440 | 3/1984 | Japan. |
| 59-78342 | 5/1984 | Japan. |
| 59-119450 | 7/1984 | Japan. |
| 60-140350 | 7/1985 | Japan. |
| 60-198818 | 10/1985 | Japan. |
| 61-106027 | 5/1986 | Japan. |
| 62-204326 | 9/1987 | Japan. |

*Primary Examiner*—W. Gary Jones
*Assistant Examiner*—Mark De Simone
*Attorney, Agent, or Firm*—Oblon, Spivak, McClelland, Maier & Neustadt

[57] ABSTRACT

A liquid coating system according to the present invention comprises, a liquid supply source, a nozzle having an inlet communicating with the liquid supply source and a substantially linear liquid discharge portion, a pressure feed unit for feeding the liquid under pressure from the liquid supply source to the nozzle by means of compressed gas, a spin chuck for fixedly supporting a semiconductor wafer, an up-and-down cylinder for causing the liquid discharge portion of the nozzle to closely face the wafer on the spin chuck, and a rotating mechanism for rotating the spin chuck. The nozzle includes a liquid reservoir, in which the liquid supplied from the liquid supply source is collected, and a large number of small passages communicating with the liquid reservoir. The liquid coating system further comprises an air operation valve disposed in a communication passage between the inlet of the nozzle and the liquid supply source and used to reduce the pressure of the liquid fed under pressure to the liquid reservoir.

7 Claims, 8 Drawing Sheets

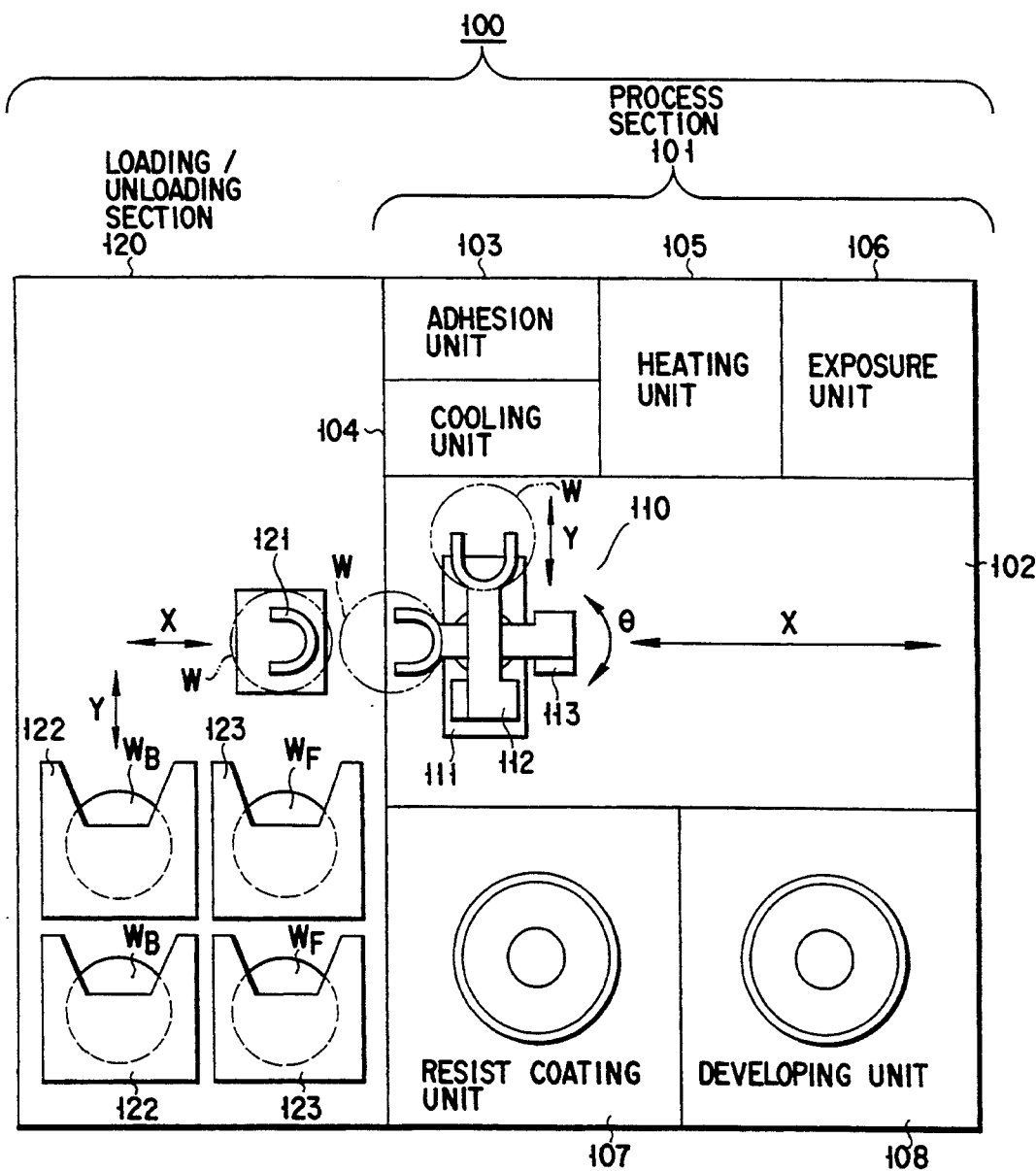
F I G. 1

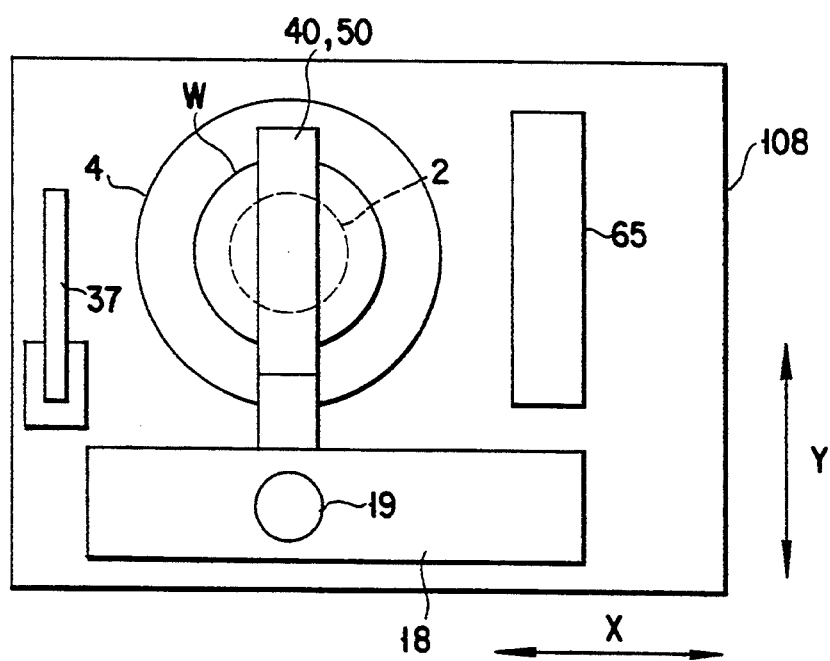
F I G. 2

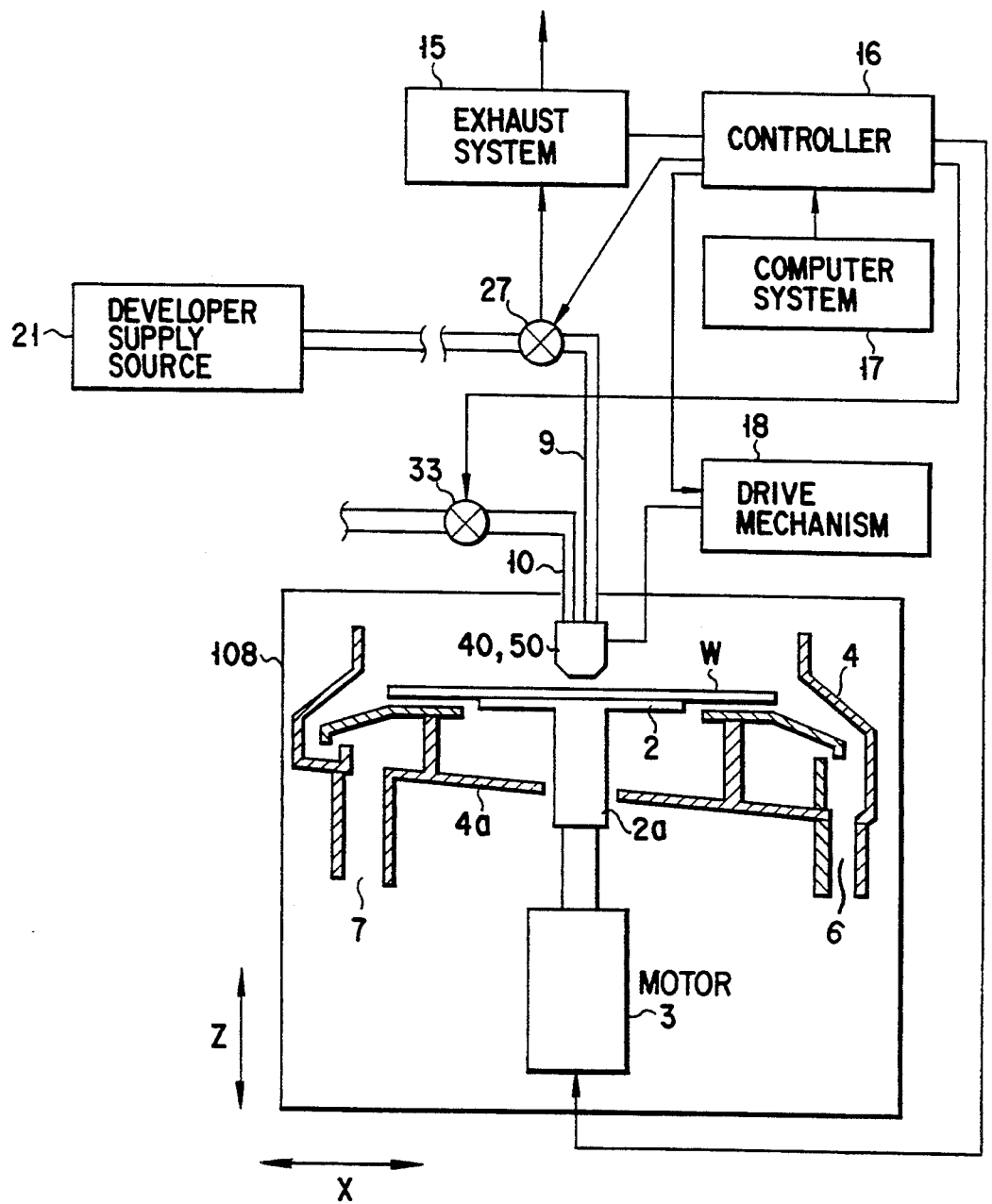
F I G. 4

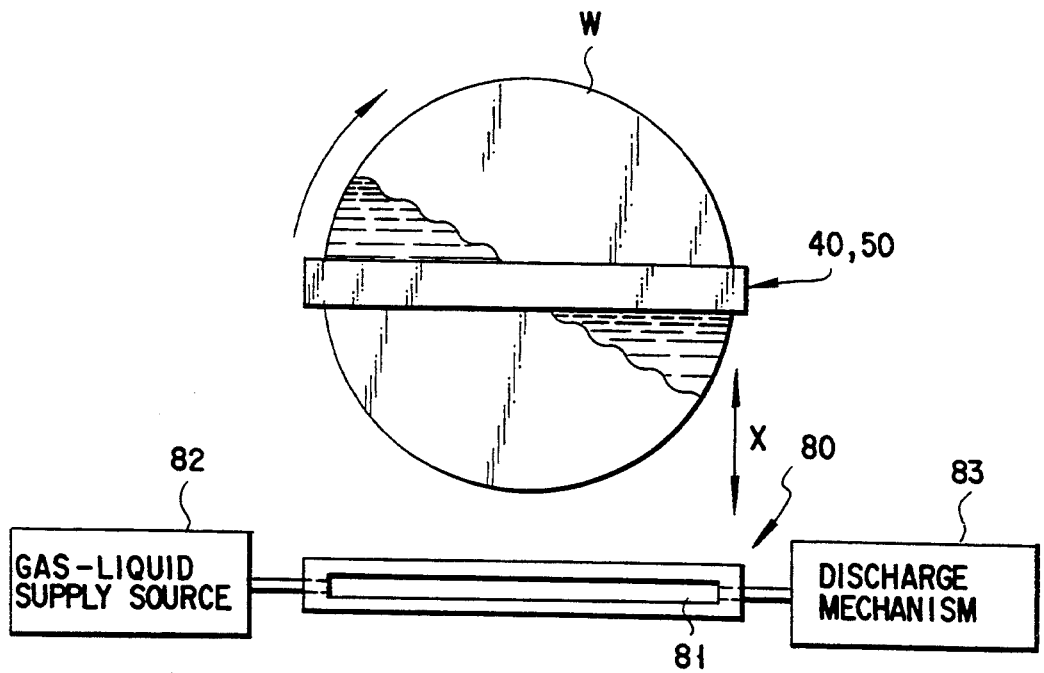
F I G. 10
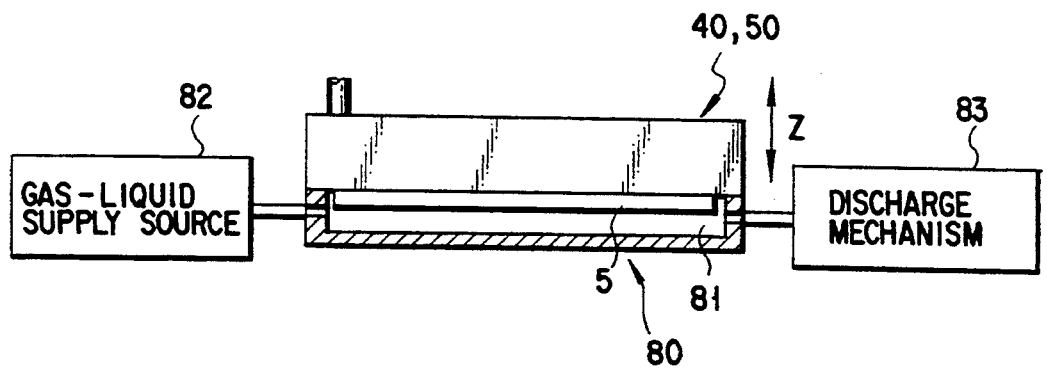
F I G. 11

LIQUID COATING SYSTEM

This application is a continuation of application Ser. No. 07/824,234, filed on Jan. 23, 1992, now abandoned.

BACKGROUND OF THE INVENTION

1. Field of the Invention

The present invention relates to a liquid coating system for applying a liquid to an object of processing, and more particularly, to a belt-shaped nozzle for uniformly applying a developer or other processing liquid to a semiconductor wafer.

2. Description of the Related Art

In a developing process, among other manufacturing processes for a semiconductor device, a developer should be uniformly applied to a resist film on a semiconductor wafer within a predetermined time. The reason is that the developing uniformity for the resist film is generally supposed to depend on the state of development, so that the development is subject to irregularity unless the developer is first uniformly supplied to the whole surface of the wafer. Conventionally, therefore, liquid coating nozzles of various types have been proposed.

Disclosed in Published Unexamined Japanese Patent Application No. 57-52132 is a nozzle which has a plurality of discharge ports arranged so as to supply a developer like a shower. If the developer is supplied like a shower from the nozzle, however, many bubbles are produced on a semiconductor wafer, and the developing time is short by several seconds during which the bubbles exist.

Disclosed in Published Unexamined Japanese Patent Application No. 57-192955 is a nozzle which has a slit-shaped discharge port arranged so as to supply a developer like a curtain. In this nozzle, however, the pressure inside a liquid reservoir cannot be uniform, so that the quantity of discharge of the developer from that slit portion which is situated near a liquid inlet for supplying the developer is larger than that from any other portion. As a result, strings of liquid discharged from the nozzle are differed, the developing uniformity is lowered. Accordingly, the pressure for liquid supply must be increased to make the liquid discharge uniform throughout the length of the belt-shaped nozzle.

If the pressure of liquid supply to the nozzle is further increased, however, the impulsive force of the liquid becomes so great that the wafer surface portion first hit by the jetted liquid is overdeveloped, that is, the development is subject to irregularity.

If the liquid supply pressure is increased, moreover, the solubility of gas in the developer increases, so that bubbles are liable to be produced in the liquid discharged from the nozzle. As a result, those portions of the wafer surface on which bubbles exist are underdeveloped, so that the developing uniformity lowers.

If the liquid discharge is increased, furthermore, the quantity of waste liquid increases, so that the running cost swells.

SUMMARY OF THE INVENTION

The object of the present invention is to provide a liquid coating system having a nozzle, which can uniformly discharge and supply a processing liquid while restraining production of bubbles, and a liquid coating method.

According to an aspect of the present invention, there is provided a liquid coating system for applying a liquid to an object of processing, which comprises: a liquid supply source; nozzle means having an inlet communicating with the liquid supply source and a substantially linear liquid discharge portion; pressure feed means for feeding the liquid under pressure from the liquid supply source to the nozzle means by means of compressed gas; a stage for fixedly supporting the object of processing; means for causing the liquid discharge portion of the nozzle means to closely face the object of processing on the stage; and means for relatively moving the stage and the nozzle means. The nozzle means includes a liquid reservoir communicating with the inlet and used to collect the liquid supplied from the liquid supply source, and a large number of small passages arranged at the liquid discharge portion and communicating with the liquid reservoir. The liquid coating system further comprises decompression means disposed in a communication passage between the inlet of the nozzle means and the liquid supply source and used to reduce the pressure of the liquid fed under pressure to the liquid reservoir of the nozzle means.

The liquid discharge portion of the nozzle is closely opposed to the object of processing or wafer, and the liquid is discharged at low pressure toward the wafer, so that bubbles cannot easily get into the discharged liquid. There are two reasons for this. One is that the solubility of gas in the low-pressure liquid is low, and the other is that no air can get involved in the liquid between the nozzle and the wafer because the liquid is oozed out at low speed.

A conductance (flow resistance) C, which is used as an index indicative of the fluidity of a fluid, is given as follows:

$$C = Q/\Delta P,$$

where Q is the flow rate of the liquid passing through the small passages, and $\Delta P$ is the difference in pressure between the inlet and outlet of each small passage.

The cross-sectional area of the small passages is smaller than that of the liquid reservoir, and the length-to-area ratio of each small passage is high, so that the conductance C at the small passages is low. Thus, the flow resistance at the small passages suddenly increases, so that the liquid can be uniformly supplied from the liquid reservoir to the small passages.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a plan layout view showing an outline of a resist processing apparatus having a large number of processing units;

FIG. 2 is a plan layout view showing an outline of a developing unit;

FIG. 4 is a system block diagram showing a drive system for the developer coating system;

FIG. 10 is a plan view showing the nozzle and a cleaning mechanism therefor;

FIG. 11 is a front view, partially in section, showing the nozzle and the cleaning mechanism;

DETAILED DESCRIPTION OF THE PREFERRED EMBODIMENTS

Figure 3:
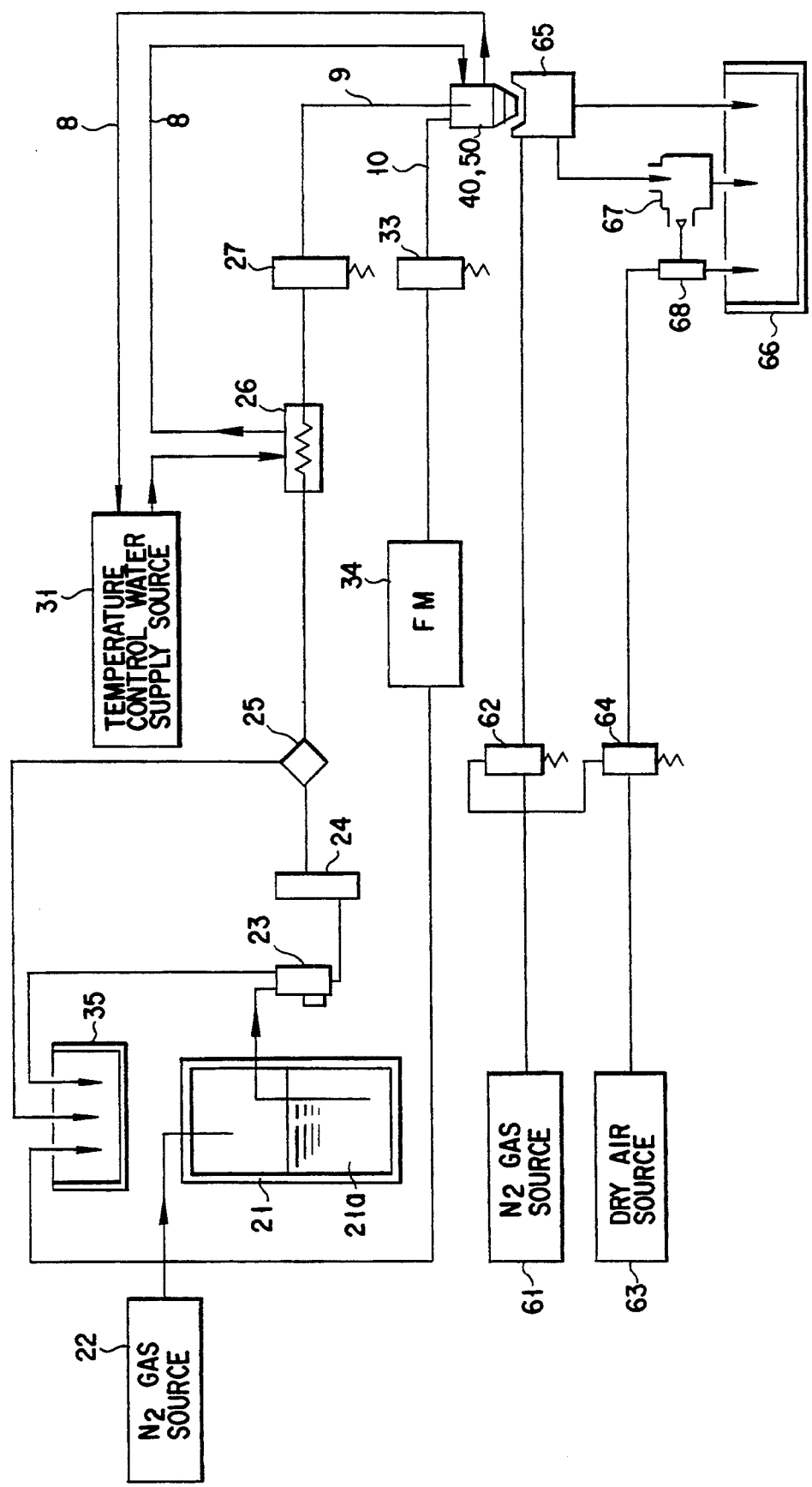
FIG. 3 is a system block diagram showing an outline of a developer coating system according to an embodiment of the present invention.

Various embodiments of the present invention will now be described with reference to the accompanying drawings.

As shown in FIG. 1, a resist processing apparatus 100 comprises a process section 101 and a loading/unloading section 120. The process section 101 is provided with a large number of processing units 103 to 108 and a center path 102. Among these processing units, the adhesion unit 103, cooling unit 104, heating unit 105, and exposure unit 106 are arranged on one side of the path 102, while the resist coating unit 107 and the developing unit 108 are arranged on the other side.

A transportation robot 110 is disposed on the center path 102. The robot 110 has a carriage 111, whereby it can travel along the path 102 (in the X-axis direction). Further, the robot 110 has a pair of handling mechanisms 112 and 113, whereby semiconductor wafers W can be delivered to and from each processing unit. The mechanisms 112 and 113 can independently move in the X-axis direction, Y-axis direction, and Z-axis direction (vertical direction, not shown) and rotate in the Θ direction.

The loading/unloading section 120 is provided with a delivery station 121 and a cassette station. The cassette station carries a plurality of wafer cassettes 122 and 123 thereon. The cassettes 122 and 123 are carried from the outside into the cassette station by means of a robot (not shown).

The delivery station 121 is provided with a mechanism for taking out the wafers W from the cassettes, mechanism for transporting the wafers to a table, mechanism for setting the wafers on the table, mechanism for centering the wafers, and mechanism for adjusting the height of the table. After the wafers W are thus positioned by means of the delivery section 121, they are carried from the loading/unloading section 120 into the process section 101 by means of the transportation robot 110.

Referring now to FIG. 2, devices laid out in the developing unit 108 will be described.

A spin coater and a nozzle drive mechanism 18 are arranged on the front and rear sides, respectively, of the developing unit 108. A nozzle bath 65 and a rinse arm 37 are arranged on both sides of the spin coater, individually.

A nozzle 40 extends from the nozzle drive mechanism 18 so as to overhang a spin chuck 2 of the coater. The mechanism 18 includes a nozzle holder (not shown), an up-and-down cylinder 19, and a horizontal cylinder (not shown). The nozzle 40 is moved for scanning within a horizontal plane by means of the horizontal cylinder. The scanning range of the nozzle 40 extends from a home position (position of the nozzle bath 65) to the center of the spin chuck 2.

The up-and-down cylinder 19 is fitted with a magnet sensor (not shown). The magnet sensor, which is used to detect the height level position of the nozzle 40 in an indirect manner, is connected to a controller (not shown) which is backed up by means of a computer. Also, the cylinder 19 is fitted with a stopper (not shown), whereby a liquid discharge port of the nozzle 40 can be stopped at a height of 0.5 to 2.0 mm above the wafer W on the spin chuck 2.

The rinse arm 37, which is fitted with a nozzle (not shown), is supplied with a rinse. The arm 37 is also provided with a horizontal cylinder (not shown), whereby it can be moved from its home position to the center of the spin chuck 2.

Referring now to FIG. 3, a developer supply system will be described.

The nozzle 40 is provided with a pair of passages 8 and two other passages 9 and 10, which constitute three channels. The passages 8 communicate with a temperature control water supply source 31 through a jacket 26. The passage 9 extends from a developer supply source 21 to the nozzle 40 via a gas-liquid separator 23, a flow meter 24, a filter 25, the jacket 26, and a first air operation valve 27 in succession. The passage (vent) 10 communicates with a second operation valve 33 and a flow meter (FM) 34.

A nitrogen gas source 22 communicates with the developer supply source 21. When pressurized nitrogen gas is supplied from the source 22 to the source 21, a developer 21a in the source 21 is fed to the nozzle 40. The respective bent passages of the gas-liquid separator 23, filter 25, and FM 34 open into a pit 35.

The nozzle bath 65 contains a solvent, and its internal atmosphere can be controlled. More specifically, a nitrogen gas source 61 and the like communicate with the bath 65 through a control valve 62 so that the vapor pressure of the solvent in the bath 65 can be controlled. When the nozzle 40 is inserted in the top portion of the nozzle bath 65, the concentration of the liquid in the passage of the nozzle 40 can be kept substantially constant.

The drain of the nozzle bath 65 communicates with a waste liquid pit 66. The bend of the bath 65 opens into the pit 66 through a liquefier 67. An air blow nozzle 68 faces a lateral opening of the liquefier 67. The nozzle 68 communicates with a dry air source 63 through a control valve 64. The respective control valves 62 and 64 of the nitrogen gas source 61 and the dry air source 63 communicate with each other.

Referring now to FIG. 4, the spin coater in the developing unit 108 will be described.

The spin chuck 2 of the coater is surrounded by a cup 4. A shaft 2a of the chuck 2 is connected to a driving shaft of an AC servomotor 3. The chuck 2 is a disk-shaped structure formed of fluoroplastics. A passage (not shown) which communicates with a vacuum pump (not shown) opens on the top surface of the spin chuck 2. Thus, the wafer W is fixed to the top surface of the chuck 2 by vacuum suction.

An output section of a controller 16 is connected to the power switch of the motor 3, whereby the starting and stopping operations and rotating speed of the motor 3 are controlled. The controller 16 is backed up by means of a computer system 17. A predetermined recipe is entered in the system 17.

A bottom portion 4a of the cup 4 is formed so that processed or waste liquid can be collected therein. The bottom portion 4a descends to a drain 6 so that the waste liquid can be discharged to the outside through the drain 6. On the other side, the bottom portion 4a of the cup 4 ascends to a vent 7 so that waste gas can be discharged to the outside through the vent 7.

An air operation valve 27 is provided in the middle of the developer supply passage 9. The valve 27 communicates with an exhaust system 15, whose drive section is connected to the output section of the controller 16.

On the other hand, a shut-off valve 33 is provided in the middle of the vent 10. The valve 33 and the air operation valve 27 are connected individually to the output section of the connector 16.

The nozzle 40 is attached to the drive mechanism 18. A motor power switch of the mechanism 18 is connected to the output section of the controller 16.

Figure 5:
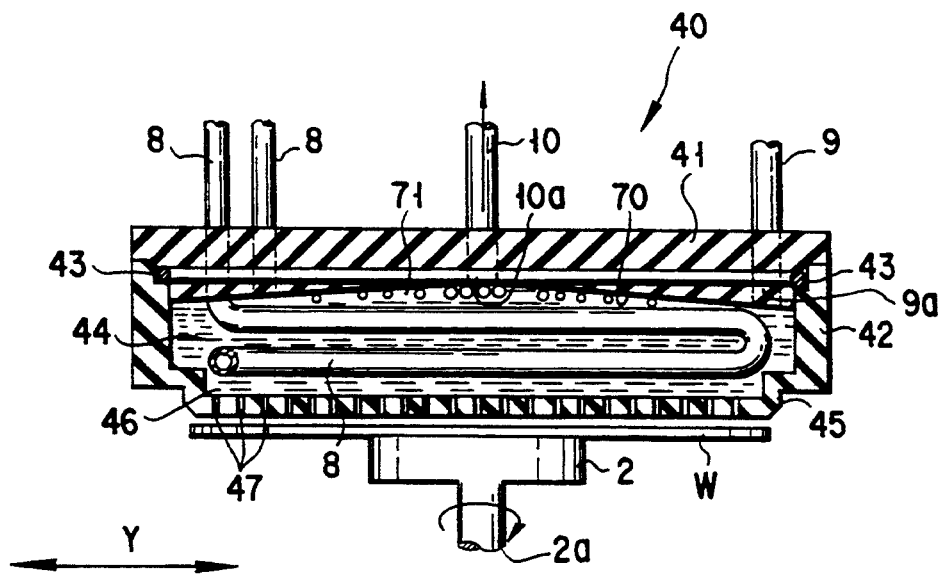
FIG. 5 is longitudinal sectional view showing a nozzle opposed to a wafer.
Figure 6:
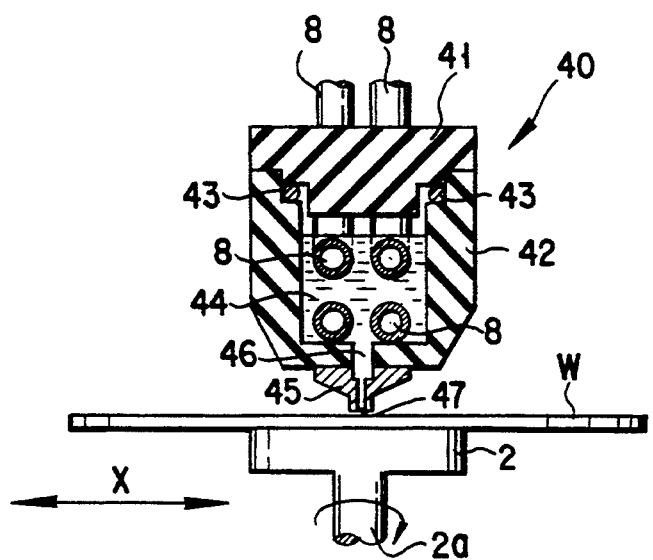
FIG. 6 is a cross-sectional view showing the nozzle opposed to the wafer.

Referring now to FIGS. 5 and 6, the nozzle 40 will be described in detail.

The nozzle 40 extends long in the horizontal direction (Y-axis direction). A top cover 41 of the nozzle 40 is provided with the heat exchanger pipes 8, an inlet 9a, and the bend 10, while a lower frame 42 has a discharge section 45. The cover 41 and the frame 42 are formed of a transparent material, such as acrylic resin. Since a liquid reservoir 44 is surrounded by the cover 41 and the frame 42, the state of the liquid in the nozzle 40 can be easily seen. The reservoir 44 and the discharge section 45, which have substantially equal lengths, extend from a region near one end portion of the nozzle 40 to a region near the other end portion thereof. An 0-ring 43 is interposed between the cover 41 and the frame 42.

The discharge section 45 is formed having a slit 46 and a large number of small passages 47. The slit 46 communicates with the liquid reservoir 44, and the small passages 47 open into the slit 46. The pitch of small passages 47 along the slit 46 is desirably 0.3-2.0 mm, and most desirably 0.6 mm. The length of each of small passages 47 is desirably 3-10 mm, and most desirably 5 mm. The average diameter of small passages 47 is 0.1-0.5 mm, and most desirably 0.2 mm. The small passages 47 may be made uniform in diameter or designed so that the ones on the discharge-port side are smaller in diameter than the ones on the reservoir side. Further, the cross-sectional shape of each small passage 47 is not limited to the shape of a circle, and may be selected among various other shapes, e.g., elliptical, square, hexagonal, etc.

Although the small passages 47 are arranged in a line according to this embodiment, they may alternatively be arranged in two lines. Although the inlet 9a is located in only one position at the peripheral edge portion of the nozzle 40, moreover, two or more inlets may be arranged in two or more positions.

The width of each of slits 46 is desirably 0.3-10 mm, and most desirably 1 mm. The length of each of slits 46 is desirably 165 mm in the case of 6-inches wafer, and it is desirably 220 mm in the case of 8-inches wafer.

An inner surface 70 of the cover 41 is inclined so that a bend opening 10a in the center of the nozzle 40 is situated on a level higher than that of the inlet 9a at the peripheral edge of the nozzle. With use of this tapered inner surface 70, bubbles 71 produced in the liquid reservoir 44 can be collected in the center of the nozzle 40 and discharged to the outside of the nozzle through the vent 10. In this case, the flow rate of exhaust gas is adjusted by means of the air operation valve 27 lest air be introduced into the liquid reservoir 44 through the small passages 47. The reason is that if the discharge through the bend 10 is too smooth, the liquid in the small passages 47 sometimes may be attracted to the liquid flowing in the reservoir 44 (by the so-called aspiration effect).

The winding pipes 8 for temperature control are arranged in the liquid reservoir 44. A heat exchange medium (e.g., water) is circulated through the pipes 8, whereby the developer in the reservoir 44 can be adjusted to a proper temperature.

Figure 7:
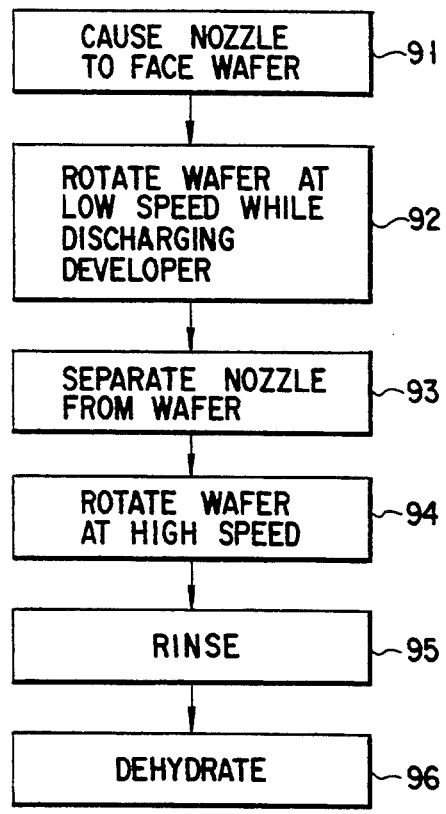
FIG. 7 is a process flow chart showing a developing process.
Figure 8:
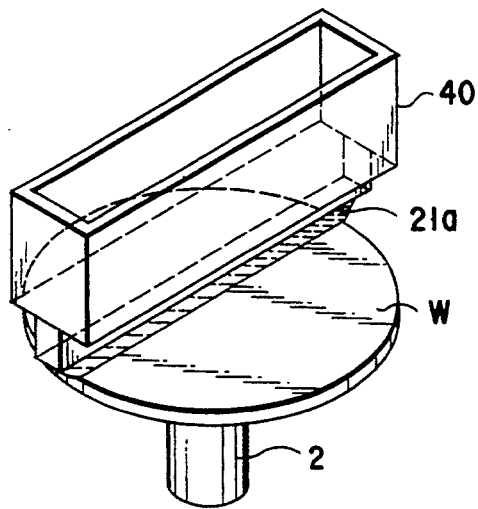
FIGS. 8 and 9 are perspective views showing the nozzle is used to apply a developer.
Figure 9:
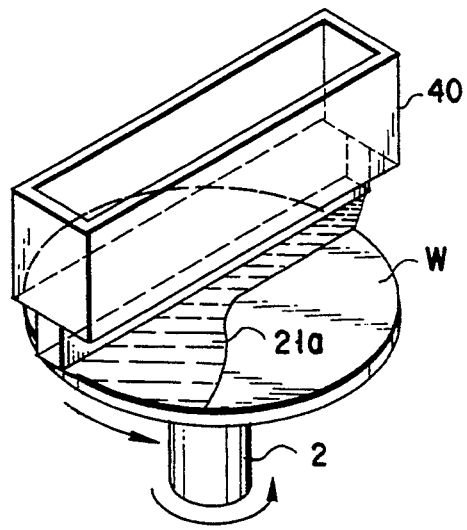

Referring now to FIGS. 7 to 9, processes for developing a silicon wafer W in the developing unit 108 will be described.

(I) A predetermined recipe for 6-inch wafer processing is entered in the memory of the computer system 17. The wafer W is delivered from the loading/unloading section 120 to the process section 101. After undergoing an adhesion process, photoresist coating process, and exposure process, the wafer W is transported to the developing unit 108 by means of the robot 110, and is placed on the spin chuck 2 by means of the handling mechanism 112. The wafer W is fixed on the chuck 2 by vacuum suction.

The nozzle 40 in the home position shown in FIG. 3 is horizontally moved so as to be situated corresponding to the center of the wafer W on the spin chuck 2, as shown in FIG. 2. Then, the nozzle 40 is lowered to the wafer W (Step 91). The standby position of the nozzle 40 is the position where the distance between the bottom end of the discharge section 45 and the upper surface of the wafer W is 0.5 mm.

(II) Pressurized nitrogen gas is introduced into the developer supply source 21, and the developer 21a from the supply source 21 is supplied to the nozzle 40. In doing this, the valve 27 is opened so that the internal pressure of that portion of the pipe 9 which extends from the valve 27 to the nozzle 40 is equal to the atmospheric pressure.

At the air operation valve 27, the developer 21a is supplied at a pressure of 0.2 to 0.3 kg/cm$^2$ (positive pressure). This supply pressure is much lower than the conventional developer supply pressure of 0.8 to 1.0 kg/cm$^2$ (positive pressure).

Accordingly, the developer 21a uniformly oozes through the small passages 47 onto the wafer W, as shown in FIG. 8. At this time, the developer 21a is adjusted to a temperature within the range of deviation of ±0.2° C. from room temperature by means of the temperature control means 26 and 31.

The developer 21a is collected into the liquid reservoir 44 via the inlet 9a, and distributed from the reservoir 44 to the individual small passages 47 through the slit 46. Further, the developer 21a oozes through the small passages 47, and the emerging threads of the developer join together. The flow resistance affecting the liquid in the nozzle is substantially proportional to the fourth power of the diameter of the nozzle passage, and is inversely proportional to the length of the nozzle passage. When the liquid is discharged from the nozzle 40, therefore, it undergoes a pressure loss, and starts to ooze out gradually.

(III) Almost the moment the developer 21a is discharged from the nozzle 40 toward the wafer W, the spin chuck 2 is rotated substantially for a half turn at 30 rpm, as shown in FIG. 9 (Step 92). As a result, the developer 21a spreads over the whole upper surface of the wafer W to ensure uniform coating. Alternatively, the nozzle 40 may be kept opposite to the wafer W at a standstill as it is horizontally moved from one end portion of the wafer W to the other in the X-axis direction.

(IV) Then, a shut-off valve (not shown) for the nitrogen gas source 22 is closed, and at the same time, the air operation valve 27 in the developer supply passage 9 and the shut-off valve 33 in the vent 10 are closed. The nozzle 40 is retreated from the center position of the wafer W to the nozzle bath 65 in the home position (Step 93).

(V) After the passage of about 60 seconds since the application of the developer 21a, the spin chuck 2 is rotated at high speed (300 rpm) (Step 94). Thereupon, the developer on the wafer W is shaken off.

(VI) While the wafer W is being rotated at high speed, the nozzle of the rinse arm 37 is opposed to the wafer W, and pure water is sprayed on the wafer W to rinse it (Step 95).

(VII) Subsequently, nitrogen gas is blown on the wafer W in high-speed rotation by means of a nozzle (not shown) to dry the wafer (Step 96). After it is dried, the wafer W is delivered from the developing unit 108 by means of the robot, and then transferred to the next step.

Since the nozzle 40 of the above-described embodiment is supplied with the low-pressure developer 21a (with low gas solubility), the bubbles 71 are hardly produced in the liquid reservoir 44, and the developer softly runs against the wafer W.

Since the developer is supplied through the air operation valve 27, moreover, the nitrogen gas for pressure feed can hardly get into the developer.

Since the inside wall of the nozzle cover 41 is tapered so that the bubbles 71 can be collectively discharged through the vent opening 10a, furthermore, the uniformity of the liquid discharged from the small passages 47 of the nozzle 40 be ensured.

Thus, the developing process can be accomplished in a short time (about 1 to 1.5 seconds), and the developer can be uniformly distributed over the whole surface of the wafer W, that is, the developing uniformity can be further improved.

According to a conventional method, about 100 cc of the developer is needed for each developing cycle. According to the method of the present embodiment, however, only a minimum necessary quantity of the developer can be thinly deposited on the wafer W, so that only about 5 to 30 cc of the developer is enough for each developing cycle. Accordingly, the quantity of the developer 21a to become the waste liquid is small, so that the cost of the developing process can be considerably reduced. Since only a small quantity of the developer is expected to be discharged, moreover, the developer cannot fall in drops from the nozzle. Since the developer is not sprayed from the nozzle but oozed out, furthermore, air cannot get involved therein after the discharge of the developer.

Referring now to FIGS. 10 and 11, a nozzle cleaning mechanism 80 will be described. A description of those portions of this second embodiment which are used in common in the first embodiment will be omitted.

The nozzle cleaning mechanism 80 is arranged on one side of the developing unit 108 so as to extend parallel to the nozzle 40. A cleaning section 81 of the mechanism 80 is channel-shaped. A gas-liquid supply source 82 communicates with one end of the cleaning section 81, and a discharge mechanism 83 with the other end. The source 82 is stored with a cleaning liquid (e.g., pure water) and a drying gas (e.g., dry nitrogen gas). The discharge mechanism 83 has a suction pump built-in.

According to the nozzle cleaning mechanism 80 arrangement in this manner, pure water and dry nitrogen gas can be forcibly circulated in the cleaning section 81 kept substantially gastight, whereby the nozzle 40 can be efficiently cleaned in a short time.

Figure 12:
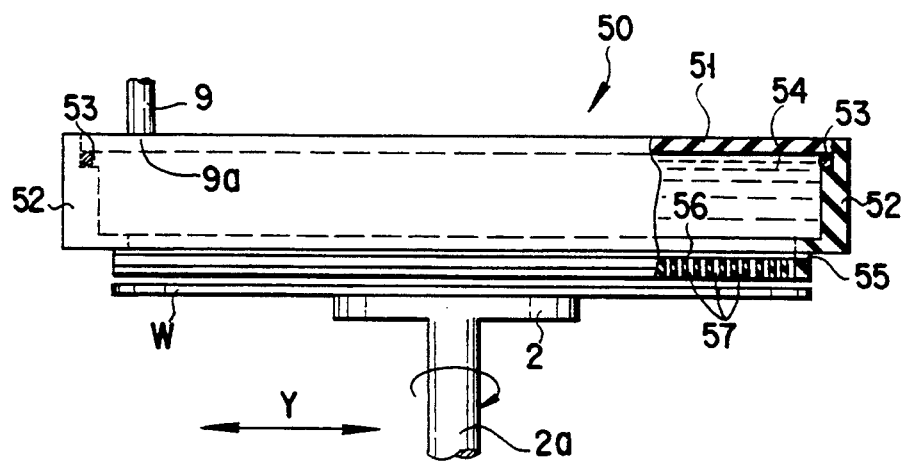
FIG. 12 is a longitudinal sectional view showing a nozzle according to another embodiment.
Figure 13:
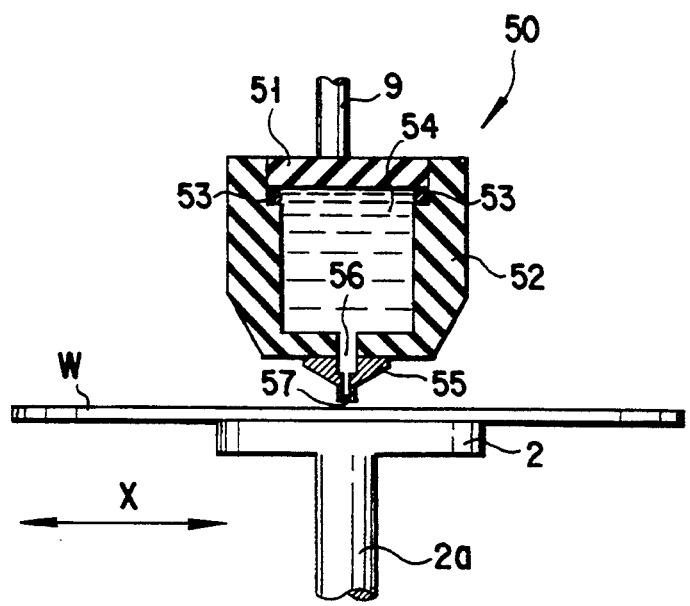
FIG. 13 is a cross-sectional view of the nozzle shown in FIG. 12.

Referring now to FIGS. 12 and 13, a nozzle 50 according to an alternative embodiment will be described.

A discharge section 55 is formed at the lower part of a body frame 52 of the nozzle 50. A cover 51 is put on the frame 52, thereby defining a liquid reservoir 54 with a rectangular cross section. The reservoir 54 has a length substantially equal to the diameter of the wafer W. A slit 56 is formed right under the reservoir 54, and a large number of small passages 57 open into the slit 56. The small passages 57, which are 27C in total number, have a diameter of about 0.2 mm, and are arranged at pitches of about 0.6 mm. In this case, the small passages 57 may have any desired diameter ranging from 0.1 to 1.0 mm, and may be arranged at any suitable pitches ranging from 0.1 to 1.0 mm.

The inlet 9a is provided in the vicinity of the peripheral edge of the liquid reservoir 54. The developer supply passage 9 communicates with the developer supply source 21.

Since the nozzle 50 is not provided with the temperature control means and bubble removing means, it is simple in construction and easy to manufacture. Even with use of the nozzle 50 of such simple construction, the bubbles 71 can be effectively prevented from being produced in the liquid reservoir 54, by supplying the low-pressure developer 21a through the developer supply passage 9.

In the embodiment described above, the liquid supply nozzle is used in the developing unit. However, the present invention is not limited to this arrangement, and the nozzle of the invention may be also used in any other devices, such as the resist coating unit and cleaning unit.

As a distinctive feature of the present invention, bubbles in the nozzle can be removed during dummy dispensation. The dummy dispensation is the discharge of the residual liquid in the liquid passage of the nozzle by idle blowing. Since the dummy dispensation is effective for a resist or other liquid whose concentration is liable to vary, it is very serviceable, from a practical point of view, that the dummy dispensation and the idle blowing can be simultaneously achieved through a single action.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A liquid supplying system for supplying a developing liquid to a top surface of a substrate, comprising:
    a developing liquid supply source;
    a nozzle means having an inlet communicating with the developing liquid supply source and a substantially linear liquid discharge portion;
    pressure feed means for feeding the developing liquid under pressure from the developing liquid supply source to the nozzle means by means of compressed gas;
    a stage for fixedly supporting the substrate;
    means for causing the liquid discharge portion of the nozzle means to closely face the top surface of the substrate on the stage; and
    means for relatively moving the stage and the nozzle means;
    said nozzle means including:
    a reservoir communicating with a lower port of the inlet and used to collect the developing liquid supplied from the developing liquid supply source, said reservoir having a top wall inclined relative to the horizontal plane;
    a number of small passages arranged at the liquid discharge portion and communicating with the reservoir; and
    a vent passage communicating with said top wall of the reservoir, a port of said vent passage being positioned higher than said port of the inlet.

2. A liquid supplying system according to claim 1, further comprising decompression means disposed in a communication passage between the inlet of the nozzle means and the developing liquid supply source for lowering the pressure of the developing liquid supplied to said reservoir.

3. A liquid supplying system according to claim 2, further comprising temperature control means for controlling a liquid temperature, provided in the communication passage between the inlet of the nozzle means and the developing liquid supply source.

4. A liquid supplying system according to claim 1, further comprising temperature control means for controlling a liquid temperature, provided in the liquid reservoir of the nozzle means.

5. A liquid supplying system according to claim 1, wherein said substrate is a semiconductor wafer, and said linear liquid discharge portion is formed to have a length substantially equal to a diameter of said wafer.

6. A liquid supplying system according to claim 1, wherein said relatively moving means is a rotating mechanism for rotating the stage.

7. A liquid supplying system for supplying a developing liquid to a top surface of a substrate, comprising:
    a developing liquid supply source;
    a nozzle means having an inlet communicating with the developing liquid supply source and a substantially linear liquid discharge portion;
    pressure feed means for feeding the developing liquid under pressure from the developing liquid supply source to the nozzle means by means of compressed gas;
    a stage for fixedly supporting the substrate;
    means for causing the liquid discharge portion of the nozzle means to closely face the top surface of the substrate on the stage; and
    means for relatively moving the stage and the nozzle means;
    said nozzle means including:
    a reservoir communicating with a lower port of the inlet and used to collect the developing liquid supplied from the developing liquid supply source, said reservoir having a top wall inclined relative to the horizontal plane;
    a number of small passages arranged at the liquid discharge portion and communicating with the reservoir;
    a vent passage communicating with said top wall of the reservoir, a port of said vent passage being positioned higher than said port of the inlet;
    a shut-off valve and a mass flow controller provided in the vent passage; and
    control means for controlling said shut-off valve, said mass flow controller and said pressure feed means.

* * * * *